US009736575B2

(12) United States Patent
Kim et al.

(10) Patent No.: US 9,736,575 B2
(45) Date of Patent: Aug. 15, 2017

(54) METHOD OF MANUFACTURING MICROPHONE IMPROVING SOUND SENSITIVITY

(71) Applicant: HYUNDAI MOTOR COMPANY, Seoul (KR)

(72) Inventors: Hyunsoo Kim, Seoul (KR); Sang Hyeok Yang, Suwon-si (KR); Sang Gyu Park, Seoul (KR); Ilseon Yoo, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/970,243

(22) Filed: Dec. 15, 2015

(65) Prior Publication Data

US 2017/0064440 A1 Mar. 2, 2017

(30) Foreign Application Priority Data

Aug. 28, 2015 (KR) ........................ 10-2015-0121845

(51) Int. Cl.

| | |
|---|---|
| ***H01L 21/00*** | (2006.01) |
| ***H04R 1/28*** | (2006.01) |
| ***H04R 1/08*** | (2006.01) |
| ***H04R 7/04*** | (2006.01) |
| ***H04R 31/00*** | (2006.01) |

(52) U.S. Cl.

CPC ............. *H04R 1/2884* (2013.01); *H04R 1/08* (2013.01); *H04R 7/04* (2013.01); *H04R 31/003* (2013.01); *H04R 31/006* (2013.01); *H04R 2201/003* (2013.01)

(58) Field of Classification Search

CPC ................................ H04R 1/2884; H04R 1/08

USPC ............................................................ 438/51

See application file for complete search history.

(56) References Cited

U.S. PATENT DOCUMENTS

| | | | | |
|---|---|---|---|---|
| 8,620,014 | B2 | 12/2013 | Maekawa et al. | |
| 8,809,974 | B2 | 8/2014 | Lo et al. | |
| 8,902,604 | B2 * | 12/2014 | Zoellin | H04R 19/005 361/761 |
| 9,056,760 | B2 | 6/2015 | Feiertag et al. | |
| 9,079,760 | B2 * | 7/2015 | Goida | H04R 1/021 |
| 9,096,424 | B2 * | 8/2015 | Conti | B81B 7/0061 |
| 9,143,849 | B2 * | 9/2015 | Zoellin | H04R 1/04 |
| 9,193,581 | B1 * | 11/2015 | Chang | B81C 1/00 |
| 9,232,302 | B2 * | 1/2016 | Minoo | H04R 1/342 |
| 9,319,764 | B2 | 4/2016 | Chen | |
| 9,363,595 | B2 * | 6/2016 | Horibe | H04R 1/406 |
| 9,374,643 | B2 * | 6/2016 | Szczech | H04R 7/10 |
| 9,386,380 | B2 | 7/2016 | Chu et al. | |
| 2008/0219482 | A1 * | 9/2008 | Sato | H04R 19/04 381/174 |

(Continued)

FOREIGN PATENT DOCUMENTS

| | | | |
|---|---|---|---|
| JP | 2013-517953 | A | 5/2013 |
| KR | 10-2011-0072990 | A | 6/2011 |
| KR | 10-1096544 | B1 | 12/2011 |

*Primary Examiner* — Caleb Henry

(74) *Attorney, Agent, or Firm* — McDermott Will & Emery LLP

(57) ABSTRACT

A method of manufacturing a microphone includes steps of forming a sound element; forming a semiconductor chip; coupling the sound element and the semiconductor chip to each other; inserting the sound element and the semiconductor chip into a case; and forming a sound hole in a lower portion of the case and in a lower portion of the sound element.

13 Claims, 6 Drawing Sheets

(56) References Cited

U.S. PATENT DOCUMENTS

2010/0246877 A1* 9/2010 Wang .................. H04R 19/005 381/361
2010/0284553 A1* 11/2010 Conti .................... B81B 7/0061 381/174
2011/0026742 A1* 2/2011 Huang .................. B81C 1/0023 381/174
2011/0186943 A1* 8/2011 Pahl ...................... B81B 7/0064 257/416
2011/0274299 A1* 11/2011 Shaw .................... B81B 7/0064 381/174
2012/0027234 A1* 2/2012 Goida ...................... H04R 1/04 381/150
2012/0181639 A1* 7/2012 Ehrenpfordt .......... B81B 7/0061 257/416
2012/0250897 A1* 10/2012 Michel ................... H04R 19/04 381/111
2012/0319174 A1* 12/2012 Wang .................. B81C 1/00246 257/254
2014/0008740 A1* 1/2014 Wang .................. B81C 1/00246 257/416
2014/0072151 A1* 3/2014 Ochs ...................... H04R 23/00 381/174
2014/0233782 A1* 8/2014 Bolognia ................. H04R 1/04 381/360
2014/0294221 A1* 10/2014 Harney .................. H04R 1/342 381/360
2014/0299948 A1* 10/2014 Wang ................... H04R 19/005 257/416
2014/0307909 A1* 10/2014 Yang ...................... H04R 19/04 381/369
2014/0367808 A1* 12/2014 Kuratani ................ H04R 19/04 257/416
2015/0003638 A1* 1/2015 Kasai ....................... H04R 1/08 381/122
2015/0023523 A1* 1/2015 Elian ...................... H04R 1/083 381/91
2015/0031160 A1* 1/2015 Wang ..................... H04R 31/00 438/53
2015/0043759 A1* 2/2015 Koji ..................... H04R 31/006 381/175
2015/0049878 A1* 2/2015 Jingming ............... H04R 1/342 381/92
2015/0054098 A1* 2/2015 Ravnkilde ............ H04R 19/005 257/416
2015/0256917 A1* 9/2015 Schelling ................. H04R 1/08 381/111
2015/0264463 A1* 9/2015 Kuzuyama ........... H04R 19/005 381/174
2015/0264464 A1* 9/2015 Okugawa ............. H04R 19/005 381/174
2015/0289045 A1* 10/2015 Khenkin .............. H04R 19/005 381/150
2015/0365751 A1* 12/2015 Schelling ............. H04R 19/005 381/171
2016/0142829 A1* 5/2016 Berger ................... H04R 23/00 381/174
2016/0165331 A1* 6/2016 Liu .......................... H04R 1/08 381/111
2016/0182987 A1* 6/2016 Lewis ...................... H04R 1/04 381/111
2016/0192085 A1* 6/2016 Lee ........................ H04R 19/04 381/174
2016/0212542 A1* 7/2016 Wang ................... H04R 19/005

* cited by examiner

METHOD OF MANUFACTURING MICROPHONE IMPROVING SOUND SENSITIVITY

CROSS-REFERENCE TO RELATED APPLICATION

This application claims the benefit of priority to Korean Patent Application No. 10-2015-0121845, filed in the Korean Intellectual Property Office on Aug. 28, 2015, the entirety of which is incorporated herein by reference.

TECHNICAL FIELD

The present disclosure relates to a microphone and a method of manufacturing the same. More particularly, the present disclosure relates to a microphone capable of improving sound sensitivity, and a method of manufacturing the same.

BACKGROUND

Generally, a microphone is a device that converts a sound into an electrical signal. A microphone may be used in various communication apparatuses such as mobile communication apparatuses, earphones, hearing aids, and the like.

Microphones have been required to have good sound performance, reliability, and operability.

In addition, microphones have been recently gradually miniaturized. Therefore, a microelectromechanical systems (MEMS) microphone using a MEMS technology has been developed.

The MEMS microphone has stronger moisture resistance and heat resistance than those of an electret condenser microphone (ECM) according to the related art, and may be miniaturized and integrated with a signal processing circuit.

MEMS microphones are divided into omni-directional microphones and directional microphones depending on the directional characteristics thereof. An omni-directional microphone is a microphone having uniform sensitivity in all directions with respect to an incident sound wave. A directional microphone is a microphone having different sensitivities depending on a direction of an incident sound wave, and is divided into a unidirectional microphone, a bidirectional microphone, and the like, depending on directional characteristics thereof. For example, the directional microphone is used in a recording operation performed in a narrow room or when only a desired sound is received in a room having large reverberation.

Since vehicles are in an environment where a sound source may be distant and noise is variably generated, a microphone robust to changes in a noise environment is required, and a unidirectional microphone that can receive a sound source only in a desired direction may be used in order to implement a microphone robust to changes in the noise environment.

When a MEMS microphone is packaged, a hole through which a sound may pass in a substrate is formed. Substrates include a printed circuit board (PCB), a ceramic substrate, or the like. Then, a die is attached and fixed onto the substrate by an epoxy or the like.

Therefore, according to the related art, in the MEMS microphone, in the case in which the size of a sound inlet formed in the substrate and the size of the sound hole of the microphone are different from each other, undesired resonance is generated, and an example of this resonance may include Helmholtz resonance generated between a narrow sound hole and a large sound inlet formed in the substrate.

The above information disclosed in this Background section is only for enhancement of understanding of the background of the disclosure and therefore it may contain information that does not form the prior art that is already known in this country to a person of ordinary skill in the art.

SUMMARY

The present disclosure has been made in an effort to provide a microphone and a method of manufacturing the same having advantages of preventing an undesired frequency response such as Helmholtz resonance that may be generated at the time of packaging the microphone by removing an alignment error of a sound hole.

An exemplary embodiment of the present invention provides a method of manufacturing a microphone, including: forming a sound element; forming a semiconductor chip; coupling the sound element and the semiconductor chip to each other; inserting the sound element and the semiconductor chip into a case; and forming a sound hole at a lower portion of the case and a lower portion of the sound element.

In the forming of the sound hole, the sound hole may be formed by simultaneously etching the lower portion of the case and the lower portion of the sound element.

The forming of the sound element may include: preparing a substrate; and forming a diaphragm and a fixed membrane on the substrate.

In the forming of the diaphragm and the fixed membrane, the diaphragm and the fixed membrane may be formed on a single layer.

The forming of the semiconductor chip may include: forming an air inlet at a lower portion of the semiconductor chip; forming a plurality of contact parts at both sides of the semiconductor chip so as to vertically penetrate through the semiconductor chip; and forming contact pads at both end portions of each of the plurality of contact parts.

The plurality of contact parts may include: a first contact part connected to a diaphragm of the sound element; and a second contact part connected to a fixed membrane of the sound element.

The coupling of the sound element and the semiconductor chip to each other may include: forming a coupling part beneath the semiconductor chip; and coupling the sound element and the semiconductor chip to each other through the coupling part.

The coupling part may be made of a metal.

Another exemplary embodiment of the present invention provides a microphone manufactured by the method of manufacturing a microphone as described above.

According to an exemplary embodiment of the present invention, an alignment error of the sound hole, which is one of factors having an influence on sound sensitivity at the time of packaging the microphone, is removed, thereby making it possible to prevent an undesired frequency response of the microphone.

In addition, according to an exemplary embodiment of the present invention, a wafer level package technology is applied directly to the semiconductor chip and the sound element, such that sizes of the semiconductor chip and the sound element are decreased, and an entire volume of the microphone is decreased, thereby making it possible to simplify a manufacturing process.

Other effects that may be obtained or predicted by an exemplary embodiment of the present invention will be disclosed explicitly or implicitly in a detailed description for an exemplary embodiment of the present invention. That is, various effects predicted according to an exemplary embodiment of the present invention will be disclosed in a detailed description to be provided below.

BRIEF DESCRIPTION OF THE DRAWINGS

FIG. 1 shows a sound element with a sound layer.

FIG. 2 shows a semiconductor substrate.

FIG. 3 shows the semiconductor chip including contact parts, contact pads and coupling part.

FIG. 4 shows the semiconductor chip coupled to the sound element through the coupling part.

FIG. 5 shows the semiconductor chip coupled to the sound part inserted in the case.

FIG. 6 shows a sound hole formed at a lower portion of the case and the sound element.

DETAILED DESCRIPTION OF THE EMBODIMENTS

Hereinafter, an exemplary embodiment of the present invention will be described with reference to the accompanying drawings. However, the accompanying drawings and a detailed description to be described below relate to one of several exemplary embodiments for effectively describing a feature of the present invention. Therefore, the present invention is not limited to only the accompanying drawings.

Further, in describing the present invention, well-known configurations or functions will not be described in detail since they may unnecessarily obscure the gist of the present inventive concept. Further, the following terminologies are defined in consideration of the functions in the present invention, and may be construed in different ways by the intention of users and operators. Therefore, the definitions thereof should be construed based on the contents throughout the specification.

In addition, in the following exemplary embodiment, terms may be appropriately modified, integrated with, and separated from each other so that those skilled in the art to which the present invention pertains may easily understand the present invention in order to efficiently describe an important technical feature of the present invention. However, the present invention is not necessarily limited thereto.

FIGS. 1 to 6 are views sequentially showing processes of a method of manufacturing a microphone according to an exemplary embodiment of the present invention.

Figure 1:
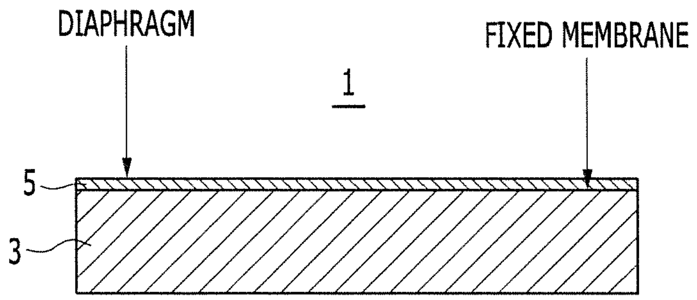
FIGS. 1 to 6 are views sequentially showing processes of a method of manufacturing a microphone according to an exemplary embodiment of the present invention.

First, a method of manufacturing a sound element shown in FIG. 1 will be briefly described.

Referring to FIG. 1, after a substrate 3 is prepared, an oxide layer is formed on one surface of the substrate 3.

A membrane is formed on the oxide layer, and a photo-resist pattern is formed on the membrane.

Then, the membrane is etched using the photo-resist pattern as a mask to form a diaphragm and a fixed membrane.

Here, the diaphragm and the fixed membrane of the sound element according to an exemplary embodiment of the present invention may be formed on one sound layer 5.

Although the case in which the diaphragm and the fixed membrane are formed on the same layer to configure the sound layer 5 has been described by way of example in a sound element 1 according to an exemplary embodiment of the present invention, the diaphragm and the fixed membrane are not necessarily limited thereto, but may also be spaced apart from each other by a predetermined gap and be formed at upper and lower positions, respectively.

In addition, the sound element 1 may be formed on the basis of a microelectromechanical systems (MEMS) technology.

The sound element 1 configured as described above serves to receive a sound signal from an external sound processing device (not shown) and transmit an output signal to a semiconductor chip 10 to be described below.

Here, the sound processing device processes a sound in a vehicle, and may be at least any one of a sound recognizing device, a hands free device, and a portable communication terminal.

When a driver issues a command as a sound, the sound recognizing device serves to recognize the command and perform the command issued by the driver.

The hands free device is connected to a portable communication terminal through short distance wireless communication, such that the driver may freely speak without holding the portable communication terminal by hand.

In addition, the portable communication terminal is a device through which the driver may wirelessly speak, and may be a smart phone, a personal digital assistant (PDA), or the like.

Figure 2:
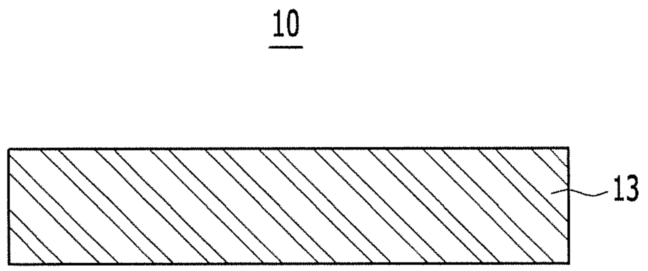
Figure 3:
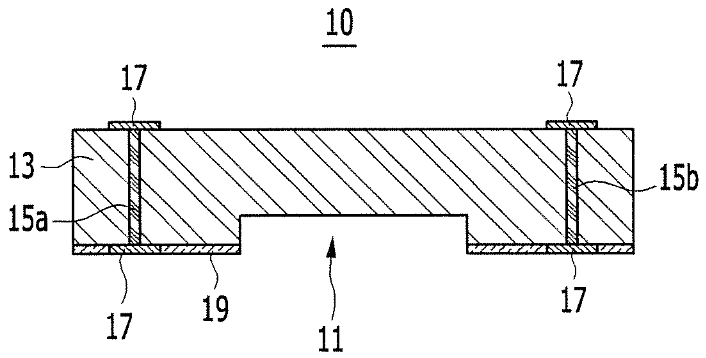

Next, referring to FIGS. 2 and 3, a process of forming a semiconductor chip 10 is performed.

In the process of forming the semiconductor chip 10, a semiconductor substrate 13 is prepared.

The semiconductor substrate 13, which is finished in a mirror shape by thinly cutting a single crystal rod of a semiconductor and polishing a surface of the single crystal rod, is also called a wafer. The semiconductor substrate 13 may be a silicon substrate made of silicon that does not have a defect at high purity, has excellent electrical characteristics, and requires a perfect crystal.

Then, after the semiconductor substrate 13 is prepared, a process of etching a lower portion of the semiconductor substrate 13 to form an air inlet 11 is performed.

In addition, a process of forming a plurality of contact parts **15*a* and 15*b* at respective sides of the semiconductor substrate 13** so as to vertically penetrate through the semiconductor substrate is performed.

The plurality of contact parts includes a first contact part **15*a* and a second contact part 15*b***.

The first contact part **15*a* is connected to the diaphragm positioned at one side of the sound layer 5 of the sound element 1, and the second contact part 15*b* is connected to the fixed membrane positioned at the other side of the sound layer 5 of the sound element 1**.

The plurality of contact parts **15*a* and 15*b*** may be formed by forming through-holes connected to the diaphragm and the fixed membrane and then inserting electrical materials and electrodes into the through-holes.

Then, contact pads 17 are formed at both end portions of each of the plurality of contact parts **15*a* and 15*b*. The contact pads 17** may be made of a metal.

The semiconductor chip 10 having the configuration as described above may be an application specific integrated circuit (ASIC).

Then, a coupling part 19 is formed beneath the semiconductor chip 10. The coupling part 19, which is to be coupled to the sound element 1, may be made of a metal.

Although an example in which the semiconductor chip 10 according to an exemplary embodiment of the present invention is formed adjacent to the sound element 1 inside a case 20 has been described, the semiconductor chip 10 is not necessarily limited thereto, but may be formed outside the case 20 and be electrically connected to the sound device 1.

Figure 4:
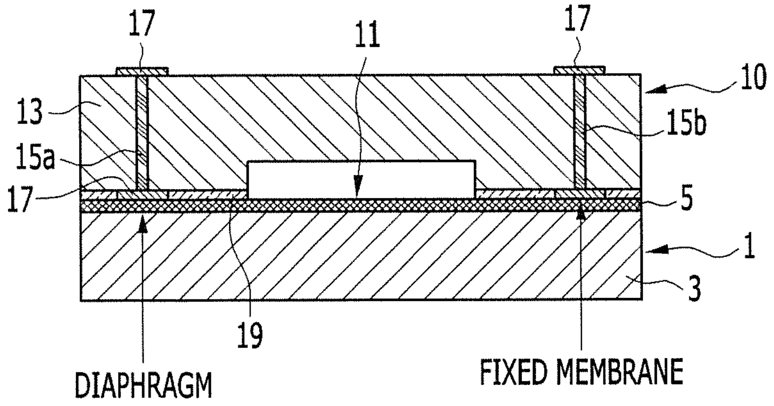

Referring to FIG. 4, a process of coupling the semiconductor chip 10 onto the sound element 1 through the coupling part 19 formed beneath the semiconductor chip 10 is performed.

Figure 5:
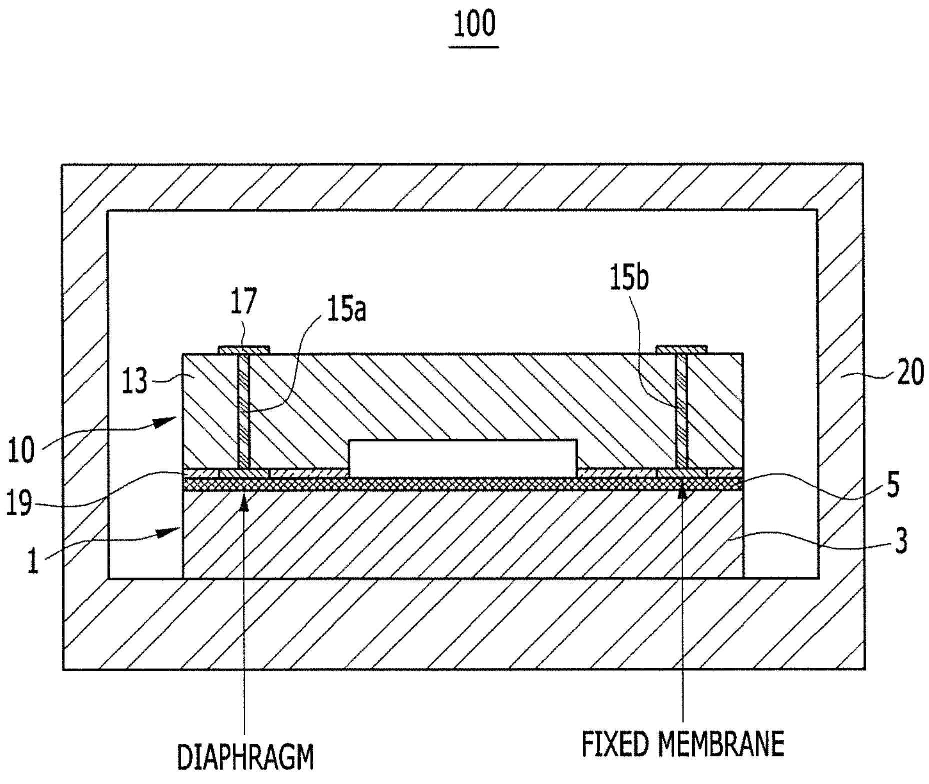

Referring to FIG. 5, a process of inserting the sound element 1 and the semiconductor chip 10 into the case 20 is performed.

Here, the case 20 may be made of any one of a metal and a ceramic.

In addition, the case 20 may have any one of a cylindrical shape and a quadrangular pillar shape.

Figure 6:
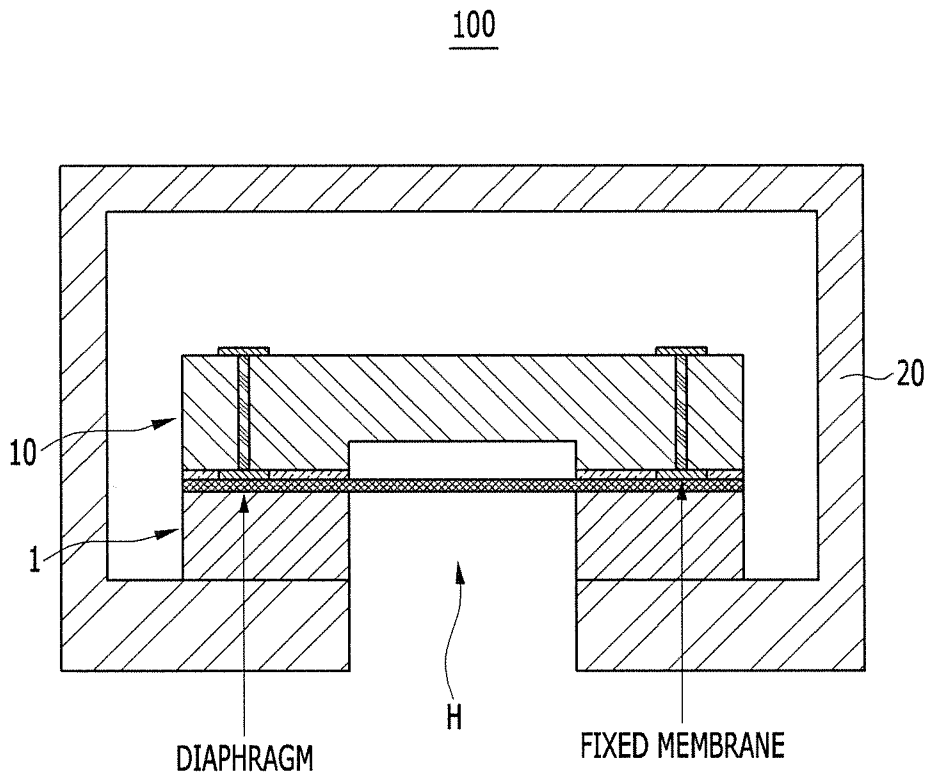

Next, referring to FIG. 6, a process of forming a sound hole H at a lower portion of the case 20 is performed.

The sound hole H may be formed by simultaneously etching the lower portion of the case 20 and a lower portion of the sound element 1.

That is, the sound hole H may be formed so as to include the lower portion of the case 20 and the lower portion of the sound element 1.

A transversal cross-section of the sound hole H may have a circular shape or a quadrangular shape.

The sound hole H is a hole through which a sound signal is introduced from the sound processing device, and the sound signal introduced through the sound hole H is transferred to the sound element 1.

Then, the sound element 1 outputs a sound output signal to the semiconductor chip 10 on the basis of the sound signal.

The semiconductor chip 10 receives the sound output signal and outputs a final signal to the outside.

Therefore, in a microphone 100 according to an exemplary embodiment of the present invention, an alignment error of the sound hole H, which is one factor having an influence on sound sensitivity at the time of packaging the sound element 1 in the case 20, is removed, thereby making it possible to improve the sound sensitivity of the microphone 100.

In addition, in the microphone 100 according to an exemplary embodiment of the present invention, the sound hole H is formed by performing an etching method once after the sound element 1 is coupled to the case 20. Therefore, an undesired frequency response such as Helmholtz resonance that may be generated at the time of packaging the microphone may be removed, and the entire size of the microphone 100 may be decreased.

While this disclosure has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A method of manufacturing a microphone, comprising steps of:

forming a sound element;

forming a semiconductor chip;

coupling the sound element and the semiconductor chip to each other;

inserting the sound element and the semiconductor chip into a case; and forming a sound hole in a lower portion of the case and in a lower portion of the sound element, wherein in the step of forming the sound hole, the sound hole is formed by simultaneously etching the lower portion of the case and the lower portion of the sound element.

2. The method of manufacturing a microphone of claim 1, wherein the step of forming the sound element includes steps of:

preparing a substrate; and forming a diaphragm and a fixed membrane on the substrate.

3. The method of manufacturing a microphone of claim 2, wherein in the step of forming the diaphragm and the fixed membrane, the diaphragm and the fixed membrane are formed on a single layer.

4. The method of manufacturing a microphone of claim 1, wherein the step of forming the semiconductor chip includes steps of:

forming an air inlet at a lower portion of the semiconductor chip;

forming a plurality of contact parts at both sides of the semiconductor chip so as to vertically penetrate through the semiconductor chip; and forming contact pads at both end portions of each of the plurality of contact parts.

5. The method of manufacturing a microphone of claim 4, wherein the plurality of contact parts include:

a first contact part connected to a diaphragm of the sound element; and a second contact part connected to a fixed membrane of the sound element.

6. The method of manufacturing a microphone of claim 1, wherein the step of coupling the sound element and the semiconductor chip to each other includes steps of:

forming a coupling part beneath the semiconductor chip; and coupling the sound element and the semiconductor chip to each other through the coupling part.

7. The method of manufacturing a microphone of claim 6, wherein the coupling part is made of a metal.

8. A microphone manufactured by the method of manufacturing a microphone of claim 1.

9. The method of manufacturing a microphone of claim 1, wherein the sound element is formed on the basis of a microelectromechanical systems (MEMS) technology.

10. The method of manufacturing a microphone of claim 1, wherein the case is made a metal.

11. The method of manufacturing a microphone of claim 1, wherein the case is made a ceramic material.

12. The method of manufacturing a microphone of claim 1, wherein the case has a cylindrical shape.

13. The method of manufacturing a microphone of claim 1, wherein the case has a quadrangular pillar shape.

* * * * *